United States Patent [19]

Miller

[11] Patent Number: 4,638,300
[45] Date of Patent: Jan. 20, 1987

[54] CENTRAL PROCESSING UNIT HAVING BUILT-IN BCD OPERATION

[75] Inventor: Michael J. Miller, San Jose, Calif.

[73] Assignee: Advanced Micro Devices, Inc., Sunnyvale, Calif.

[21] Appl. No.: 376,317

[22] Filed: May 10, 1982

[51] Int. Cl.$^4$ .................. H03K 13/24; G06F 5/006
[52] U.S. Cl. .................... 340/347 DD; 235/311; 364/781; 364/784
[58] Field of Search ............... 340/347 DD; 235/310, 235/311; 364/754–757, 768, 772, 781–787

[56] References Cited

U.S. PATENT DOCUMENTS

| | | | |
|---|---|---|---|
| 3,500,383 | 3/1970 | Pross, Jr. ........................ | 235/311 |
| 3,524,976 | 8/1970 | Wang ............................. | 235/311 |
| 3,564,225 | 2/1971 | Watson, Jr. ................. | 340/347 DD |
| 3,579,267 | 5/1971 | Wright ........................... | 235/311 |
| 3,584,206 | 6/1971 | Evans ............................ | 364/772 |
| 3,697,733 | 10/1972 | Toole ........................... | 235/311 |
| 3,882,483 | 5/1975 | Burke et al. ............... | 340/347 DD |
| 3,932,739 | 1/1976 | Lutz et al. ................... | 235/311 |
| 4,069,478 | 1/1978 | Miller ...................... | 340/347 DD |
| 4,138,731 | 2/1979 | Kamimoto et al. ............ | 364/783 |

Primary Examiner—Vit W. Miska
Attorney, Agent, or Firm—Patrick T. King; Kenneth B. Salomon; J. Vincent Tortolano

[57] ABSTRACT

A CPU data path portion having an ALU, an adjuster unit, a shifter unit and a shift register unit is disclosed. The CPU is capable of selectively forming the sum or difference of a first BCD operand and a second BCD operand by arithmetically combining the operands with the ALU to form binary results, the results dependent upon the arithmetic operation selected and adjusting the results with the adjuster unit into BCD, the adjustment also dependent upon the arithmetic operation selected. The CPU is further capable of selectively converting an operand from binary to BCD format or from BCD to binary format by iteratively shifting the operand between the shifter unit and the shift register unit and correcting the operand with the ALU, the direction of the shift and the ALU correction dependent upon the conversion selected.

13 Claims, 12 Drawing Figures

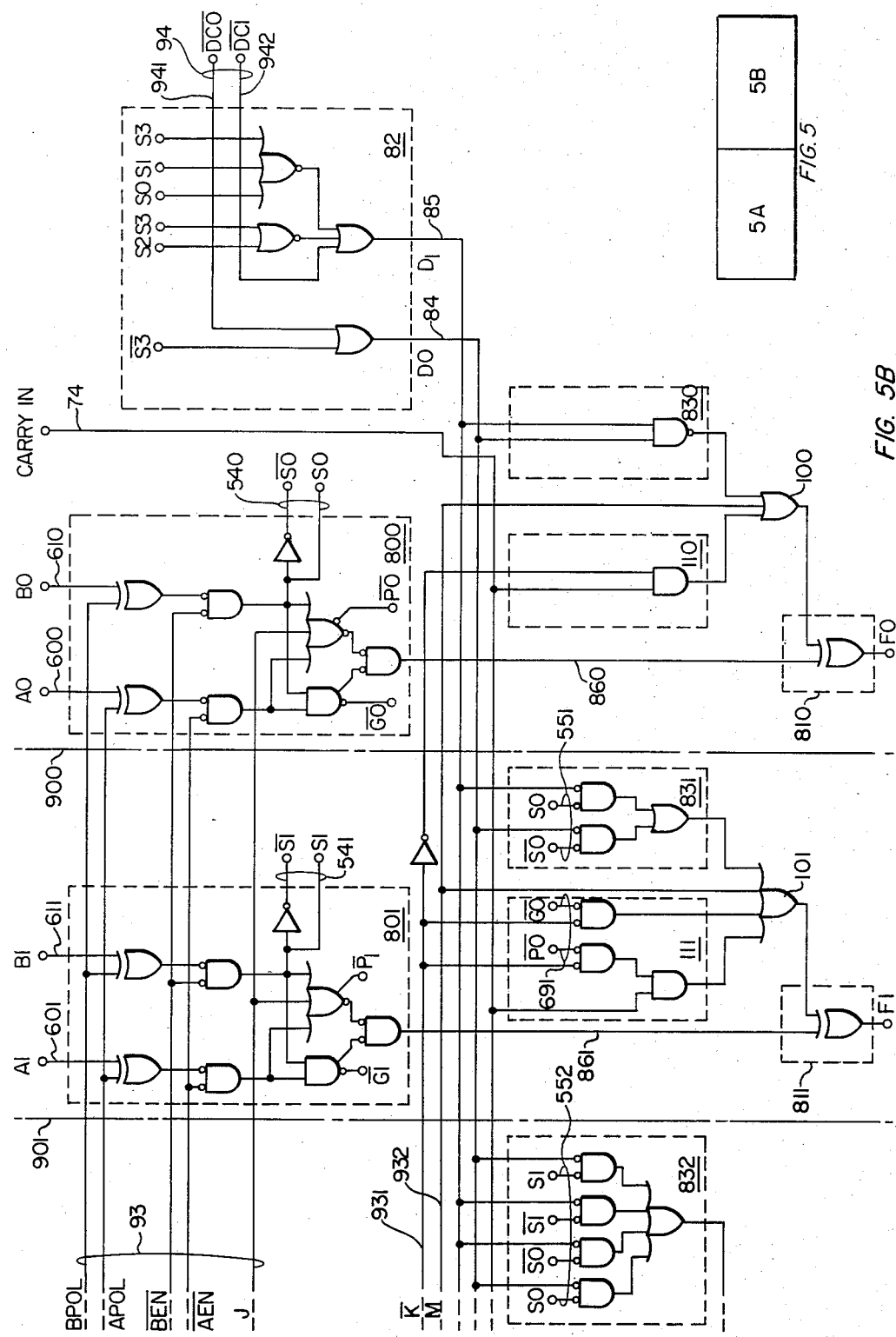

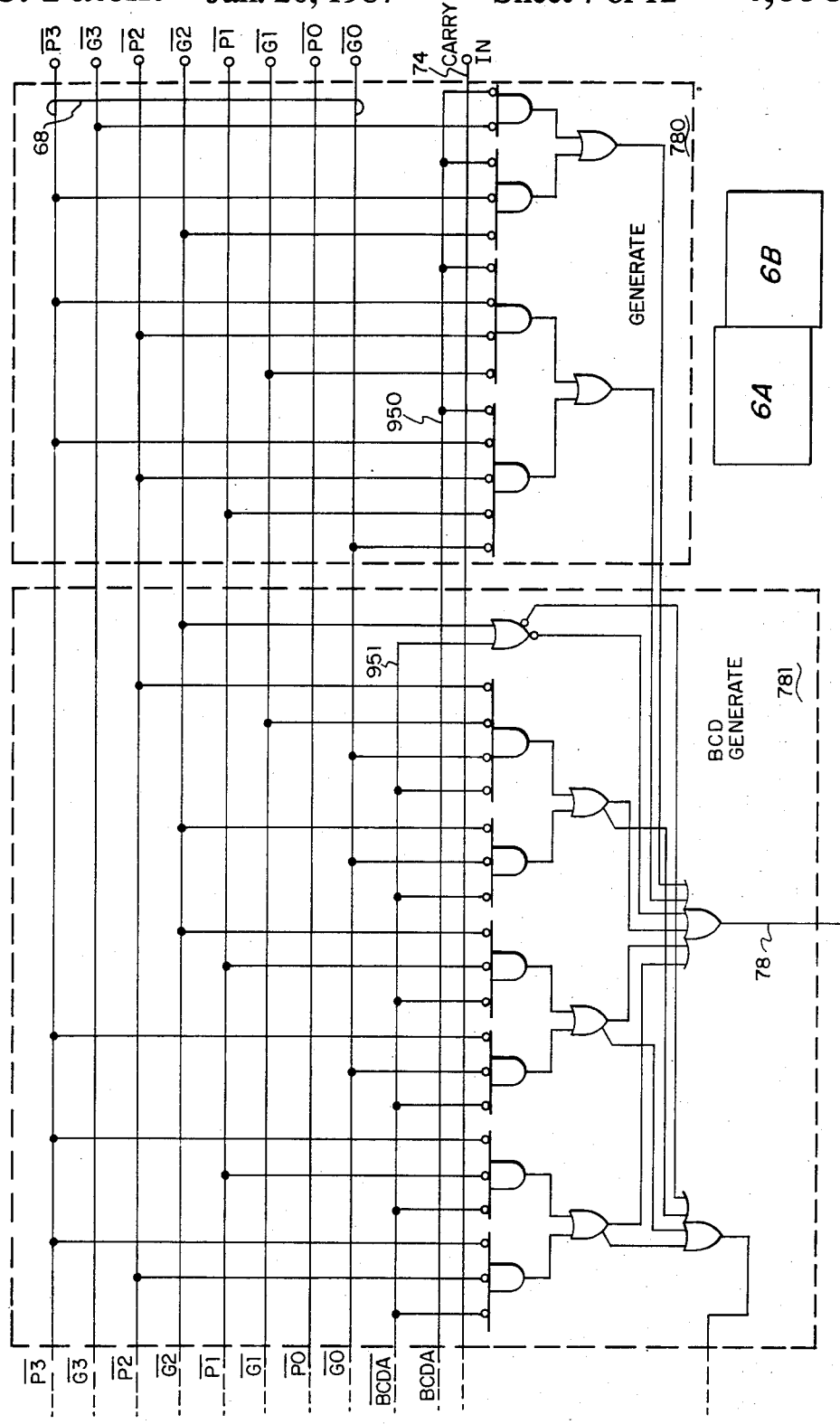

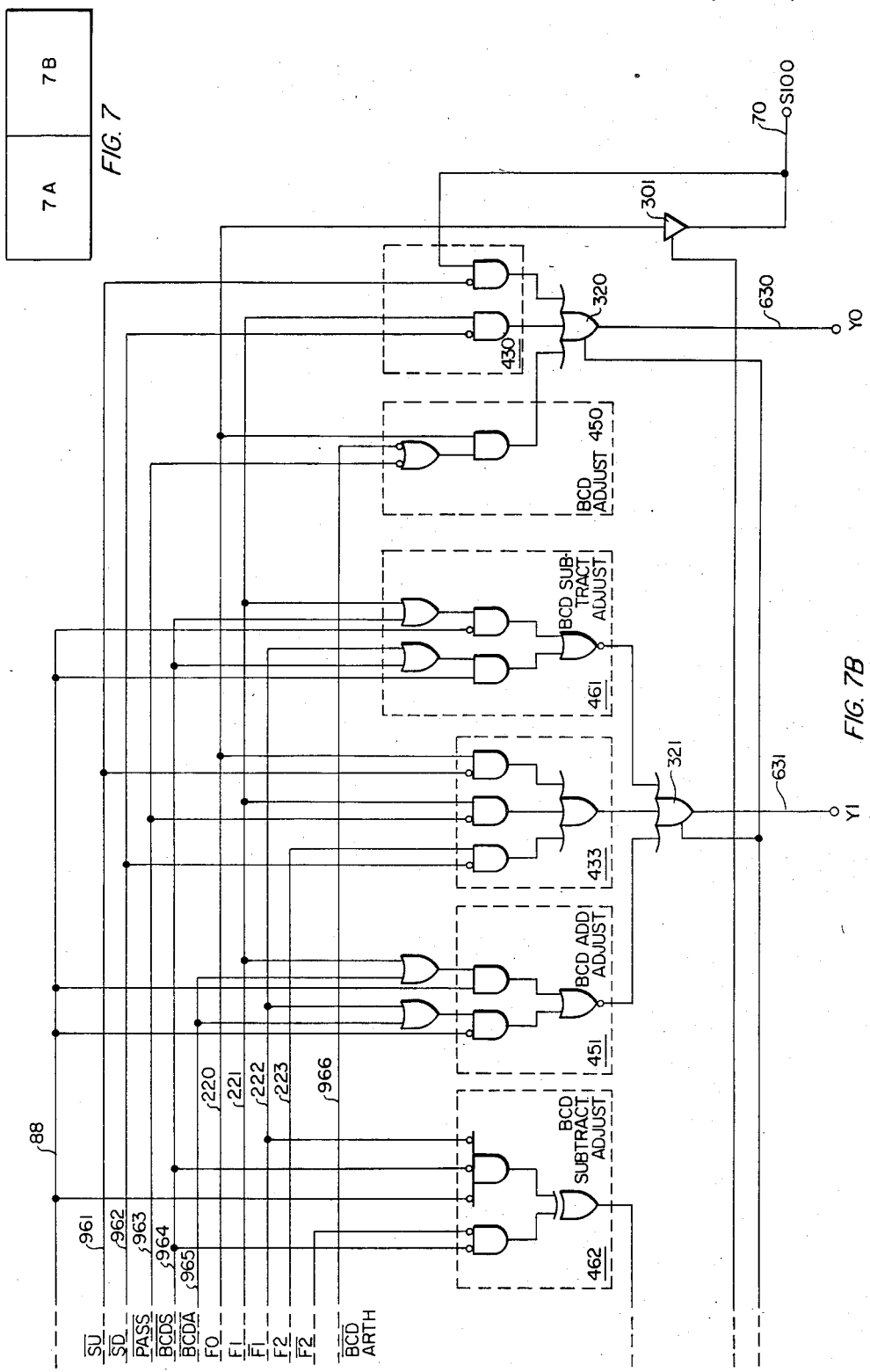

| | CONTENTS OF FILE REGISTER 10 | | | | CONTENTS OF SHIFT REGISTER 14 | |
|---|---|---|---|---|---|---|
| CYCLE | DIGIT 3 | DIGIT 2 | DIGIT 1 | DIGIT 0 | | OPERATION |
| | 0000 | 1001 | 0000 | 0100 | | |
| 1 | 001 | 0100 | 1000 | 0010 | 0 | SHIFT |
| | 001 | 0100 | 0101 | 0010 | | CORRECT DIGIT 1 |
| 2 | 00 | 1010 | 0010 | 1001 | 00 | SHIFT |
| | 00 | 0111 | 0010 | 0110 | | CORRECT DIGITS 2,0 |
| 3 | 0 | 0011 | 1001 | 0011 | 000 | SHIFT |
| | 0 | 0011 | 0110 | 0011 | | CORRECT DIGIT 1 |
| 4 | | 0001 | 1011 | 0001 | 1000 | SHIFT |
| | | 0001 | 1000 | 0001 | | CORRECT DIGIT 1 |
| 5 | | 000 | 1100 | 0000 | 11000 | SHIFT |
| | | 000 | 1001 | 0000 | | CORRECT DIGIT 1 |
| 6 | | 00 | 0100 | 1000 | 011000 | SHIFT |
| | | 00 | 0100 | 0101 | | CORRECT DIGIT 0 |
| 7 | | 0 | 0010 | 0010 | 1011000 | SHIFT |
| | | 0 | 0010 | 0010 | | CORRECT NONE |
| 8 | | | 0001 | 0001 | 01011000 | SHIFT |
| | | | 0001 | 0001 | | CORRECT NONE |
| 9 | | | 000 | 1000 | 101011000 | SHIFT |
| | | | 000 | 0101 | | CORRECT DIGIT 0 |
| 10 | | | 00 | 0010 | 1101011000 | SHIFT |
| | | | 00 | 0010 | | CORRECT NONE |
| 11 | | | 0 | 0001 | 01101011000 | SHIFT |
| | | | 0 | 0001 | | CORRECT NONE |
| 12 | | | | 0000 | 101101011000 | SHIFT |
| | | | | 0000 | | CORRECT NONE |
| 13 | | | | 000 | 0101101011000 | SHIFT |
| | | | | 000 | | CORRECT NONE |
| 14 | | | | 00 | 00101101011000 | SHIFT |
| | | | | 00 | | CORRECT NONE |
| 15 | | | | 0 | 000101101011000 | SHIFT |
| | | | | 0 | | CORRECT NONE |
| 16 | | | | | 0000101101011000 | SHIFT |
| | | | | | | CORRECT NONE |
| RESULT | | | | | 0000101101011000 | |

BCD TO BINARY CONVERSION

FIG. 8A

|  | CONTENTS OF FILE REGISTER 10 | | | | CONTENTS OF SHIFT REGISTER 14 | |
|---|---|---|---|---|---|---|
| CYCLE | DIGIT 3 | DIGIT 2 | DIGIT 1 | DIGIT 0 | | OPERATION |
|  |  |  |  |  | 0000 1011 1010 1100 0 |  |
| 1 |  |  |  |  | 0000 1011 1010 1100 0 | CORRECT |
|  |  |  |  | 0 | 0001 0110 1011 000 | SHIFT |
| 2 |  |  |  |  | 0001 0110 1011 000 | CORRECT NONE |
|  |  |  |  | 00 | 0010 1101 0110 00 | SHIFT |
| 3 |  |  |  |  | 0010 1101 0110 00 | CORRECT NONE |
|  |  |  |  | 000 | 0101 1010 1100 0 | SHIFT |
| 4 |  |  |  | 000 |  | CORRECT NONE |
|  |  |  |  | 0000 | 1011 0101 1000 | SHIFT |
| 5 |  |  |  | 0000 |  | CORRECT NONE |
|  |  |  | 0 | 0001 | 0110 1011 000 | SHIFT |
| 6 |  |  | 0 | 0001 |  | CORRECT NONE |
|  |  |  | 00 | 0010 | 1101 0110 00 | SHIFT |
| 7 |  |  | 00 | 0010 |  | CORRECT NONE |
|  |  |  | 000 | 0101 | 1010 1100 0 | SHIFT |
| 8 |  |  | 000 | 1000 |  | CORRECT DIGIT 0 |
|  |  |  | 0001 | 0001 | 0101 1000 | SHIFT |
| 9 |  |  | 0001 | 0001 |  | CORRECT NONE |
|  |  | 0 | 0010 | 0010 | 1011 000 | SHIFT |
| 10 |  | 0 | 0010 | 0010 |  | CORRECT NONE |
|  |  | 00 | 0100 | 0101 | 0110 00 | SHIFT |
| 11 |  | 00 | 0100 | 1000 |  | CORRECT DIGIT 0 |
|  |  | 000 | 1001 | 0000 | 1100 0 | SHIFT |
| 12 |  | 000 | 1100 | 0000 |  | CORRECT DIGIT 1 |
|  |  | 0001 | 1000 | 0001 | 1000 | SHIFT |
| 13 |  | 0001 | 1011 | 0001 |  | CORRECT DIGIT 1 |
|  | 0 | 0011 | 0110 | 0011 | 000 | SHIFT |
| 14 | 0 | 0011 | 1001 | 0011 |  | CORRECT DIGIT 1 |
|  | 00 | 0111 | 0010 | 0110 | 00 | SHIFT |
| 15 | 00 | 0010 | 0010 | 1001 |  | CORRECT DIGIT 2 |
|  | 001 | 0100 | 0101 | 0010 | 0 | SHIFT |
| 16 | 001 | 0100 | 1000 | 0010 |  | CORRECT DIGIT 1 |
|  | 0010 | 1001 | 0000 | 0100 |  | SHIFT |
| RESULT | 0010 | 1001 | 0000 | 0100 |  |  |
|  | (2) | (9) | (0) | (4) |  |  |

BINARY TO BCD CONVERSION

FIG. 8B

CENTRAL PROCESSING UNIT HAVING BUILT-IN BCD OPERATION

BACKGROUND OF THE INVENTION

The present invention relates to data processing systems and, more particularly, to systems within a central processing unit of the data processing system capable of performing BCD arithmetic operations and conversions to and from binary.

Typically, the data path portion of a central processing unit (CPU) of a data processing system has a configuration as shown in FIG. 1. The arrows in this figure illustrate the flow of data with the broad arrow indicating a set of data in the form of signals representing "1"'s and "0"'s moving through the data path simultaneously and the narrow arrows indicating the signal path of a single datum. The heart of the CPU data path portion is an ALU (arithmetic logic unit) 11, which performs the various arithmetic and logic operations upon operands which are fed into the ALU as input signals. FIG. 1 shows the source of these operand signals to be a register file 10 which sends the operands A and B indicated by the arrows 20 and 21 into the ALU 11. The result of the ALU operation is placed upon the data path 22.

A shifter 12 receives these data signals and can shift these signals "up" or "down" depending upon the operation required of the CPU. For a shift "up" each of the signals of a data set from the ALU is shifted into the next more significant place. A shift "down", on the other hand, shifts each of the data signals into the next less significant place. The data, which, in being shifted up, are shifted into the the shifter 12, are transferred into a shift register 14 one datum or bit at a time. Similarly, if the shifter 12 shifts down, the information shifted out also passes to the shift register 14 one bit at a time. The shift register 14 can also shift data back into the shifter 12. The paths along which the data is shifted between the shifter 12 and the shift register 14 are indicated by the bidirectional arrows 30, 30A, 30B and 30C. These paths vary in accordance with the operation the CPU is required to perform. For conversions of operands in binary format to BCD format or from BCD to binary, the path 30 is used.

The contents of the shift register 14 may be accessed as output signals as indicated by the bidirectional arrows 28, 29 or reentered into the shift register 14 for another operation by the data path 25. Information from the shifter 12 may be accessed immediately as output signals along the path 23 and 29. Alternatively, the results of the ALU 11 and the shifter 12 operations may be sent along the paths 23, 24 back into the register file 10. In this manner, operations, such as division and multiplication, requiring iterative operations by the ALU 11 and the shifting units 12, 14, may be performed. The final result appears at the end of these multiple operation as output signals on the path 29.

The data path 29 is bidirectional so that data outside of the system may be fed into the system. One such example is the transfer of data from memory (not shown) to the CPU along the data paths 29, 24 to be stored into the register file 10 for processing by ALU 11.

Not shown here is a control unit which comprises the other major portion of the CPU which handles the control functions for each of the elements of the data path in the CPU and their timing so that the operation and transmission of data between these elements proceeds in an orderly manner. Such designs and techniques are well known.

However, most operations in these data processing systems are performed in binary format. In certain systems, such as those having CRT display intensive operations, a BCD (binary coded decimal) format is desirable. Software is sometimes used to achieve BCD format results, though the system continues to operate in binary. To avoid the relative lack of speed in a software implementation, hardware alternatives have also been used.

The present invention is a significant advance over the prior art in which, by a novel design in the subsystems of the CPU of a data precessing system, arithmetic operations in BCD format are accelerated and time intervals for converting an operand in binary to BCD and to binary from BCD are minimized. This design of the CPU is attained without disturbing the design of the original circuitry so that the features of the prior-designed subsystems operating a binary are retained. Thus, the present invention permits the CPU to offer results to the user of the system in binary or BCD, as desired.

SUMMARY OF THE INVENTION

The present invention provides for a CPU data path portion having an ALU, an adjuster unit, a shifter unit and a shift register unit. The CPU is capable of selectively forming the sum or difference of a first BCD operand and a second BCD operand by arithmetically combining the operands with the ALU to form binary results, the results dependent upon the arithmetic operation selected and adjusting the results with the adjuster unit into BCD, the adjustment also dependent upon the arithmetic operation selected.

The CPU is further capable of selectively converting an operand from binary to BCD format or from BCD to binary format by interatively shifting the operand between the shifter unit and the shift register unit and correcting the operand with the ALU, the direction of the shift and the ALU correction dependent upon the conversion selected.

The invention also provides for a circuit capable of forming the sum or difference of a first BCD digit and a second BCD digit responsive to control signals having means for combining the first and second BCD digits in arithmetic operations of addition or subtraction as binary members with carry-in to form a first result, the operation selected by the control signals, means responsive to signals from the combining means for determining whether the first result is compatible with BCD format, and means responsive to the determining means for adjusting the first result into BCD format.

Finally, the present invention provides for, in a circuit for selectively converting digital signals from binary into BCD or BCD to binary by shifting and correcting the digital signals, an ALU for correcting the digital signals comprising first half adder and logic means responsive to the digital signals for generating true and complementary signals of the digital signals, recognition logic means responsive to the true and complementary signals for generating enabling signals, correction logic means responsive to the enabling signals and the true and complementary signals for generating correction signals, and second half adder means responsive to the true and correction signals for generating the corrected signals.

BRIEF DESCRIPTION OF THE DRAWINGS

A further understanding of the present invention may be achieved by a reading of the detailed description of the invention below and reference to the following drawings:

FIG. 5 shows the logic circuits of the ALU with BCD-binary correction capability.

FIG. 6 shows the logic gates of the group carry generate and propagate block with BCD arithmetic operation capability.

FIG. 7 illustrates the logic gates of the shifter/adjuster used in the present invention.

FIG. 8A illustrates by an example the steps by which an operand in BCD format is converted into binary format iteratively; FIG. 8B illustrates by an example the iterative steps by which a binary operand is converted ito BCD.

DETAILED DESCRIPTION

Figure 1:
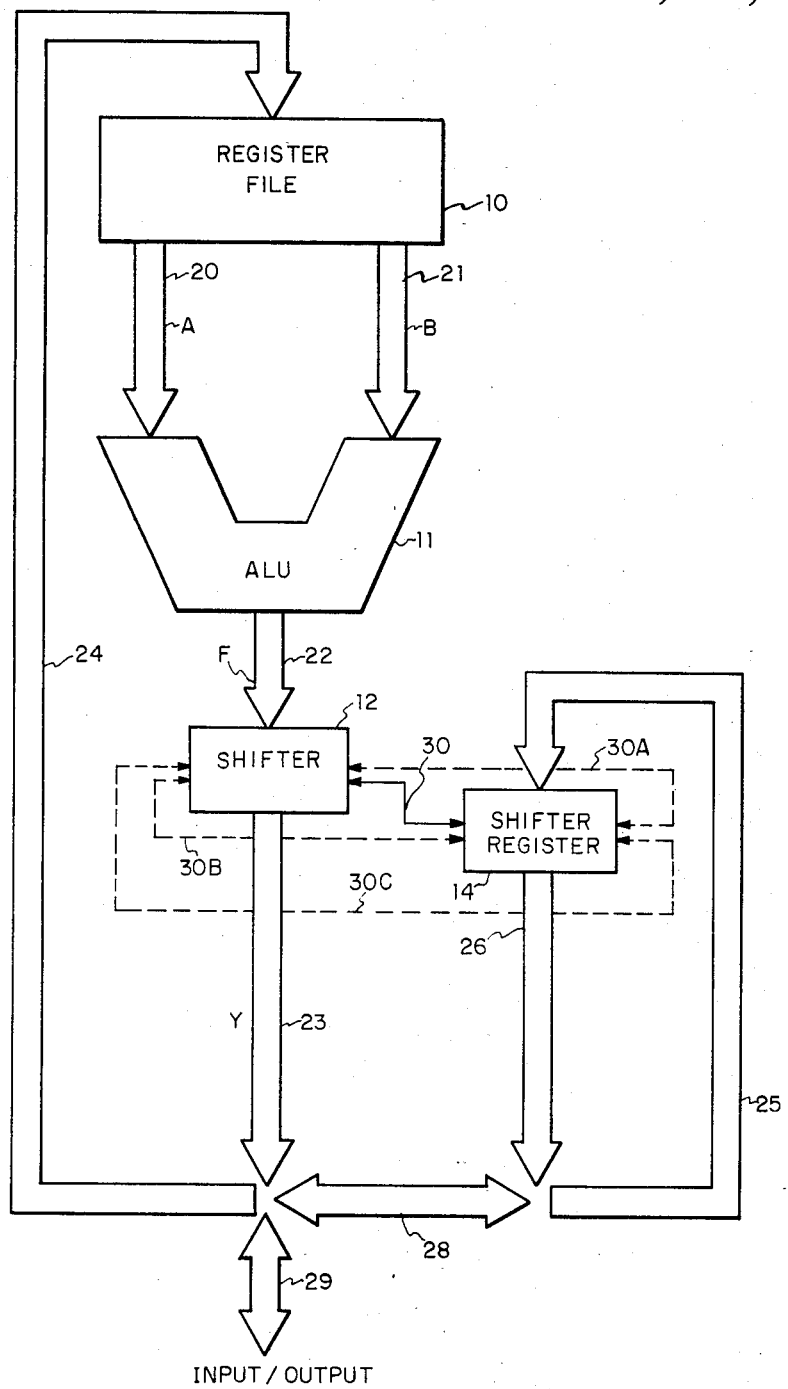
FIG. 1 is a typical system configuration of a CPU data path portion in a data processing system.

Specific implementations of the system shown in FIG. 1 are explained on pages 93 through 127 of *Bit-Slice Microprocessor Design* by J. Mick and J. Brick, McGraw Hill, New York, 1980, which book is incorporated by reference herein. The designs in this book deal with bit-slice computer system architecture by which integrated circuits connected mostly in parallel form a CPU having an ALU, register file, and shifters capable of processing data of a desired width in increments of 4 bits. It should be noted, however, that present invention is not limited to bit-slice architecture design.

The present invention provides for novel designs in the ALU 11, including carry lookahead logic within the ALU 11, and the shifter 12, which are shown in FIG. 1. By these designs, the CPU in FIG. 1 can convert operands in BCD format to binary format and from binary format to BCD. Furthermore, the ALU 11 can perform BCD arithmetic on operands in BCD. All these operations of BCD conversion and arithmetic are achieved with a minimum of time delay so that high speed BCD operations are attained and with a minimum disruption in design to maintain the features of the existing designs.

Figure 2:
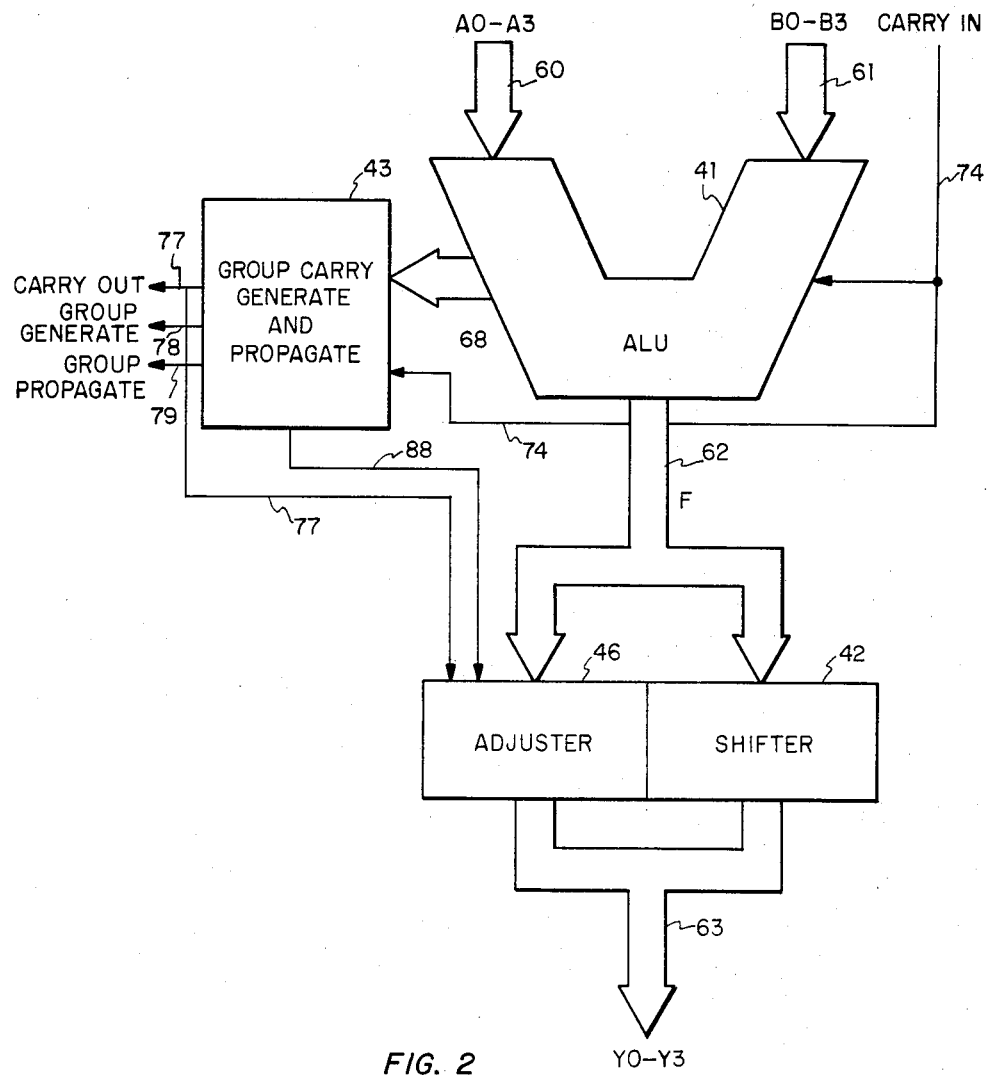
FIG. 2 is a more detailed view of the interrelationships between the ALU group carry generate and propagate block and the shifter/adjuster unit in the present invention.

FIG. 2 is a block diagram of the components of the present invention, which fits into the system in FIG. 1. The components are an ALU unit 41, a group carry generate and propagate block 43, a shifter unit 42 and an adjuster unit 46. Each of these units handle 4 bits of information at a time, and are connected in parallel with similar units to form parts of a complete CPU, as that shown in FIG. 1. The ALU unit 41 receives the input signals, A0–A3 and B0–B3, of two operands A and B, and the carry in signal on the line 74 from an identical ALU unit handling the next less significant 4 bit places of the operands A and B.

Closely coupled to each ALU unit 41 is a group carry generate and propagate block. From generate and propagate signals internal to the unit 41, the block 41 processes these signals on the path 68 and the carry in signal to generate a carry out signal, which acts as a carry in signal to the ALU unit handling the next more significant 4 bits of the operands A and B. Additionally, the block 43 generates group carry and propagate signals for overall group carry lookahead logic (not shown) which speeds the processing time of the overall ALU 11 comprised of the parallel 4-bit ALU units 41, a commonly used technique.

The processed results, F0–F3, of the ALU unit 41 are sent to the 4 bit shifter 42 and adjuster 46 on the path 62. While the shifter and adjuster units 42, 46 are shown separately, they may be combined into a single shifter/adjuster unit connected to similar shifter/adjuster units by the lines 70 and 71. The shifter unit 42 functions as part of the shifter 12 described previously. The adjuster unit 46, responsive to a BCD carry out signal adjusts the ALU result signals F0–F3 into proper BCD format when BCD arithmetic is being performed.

Figure 3:
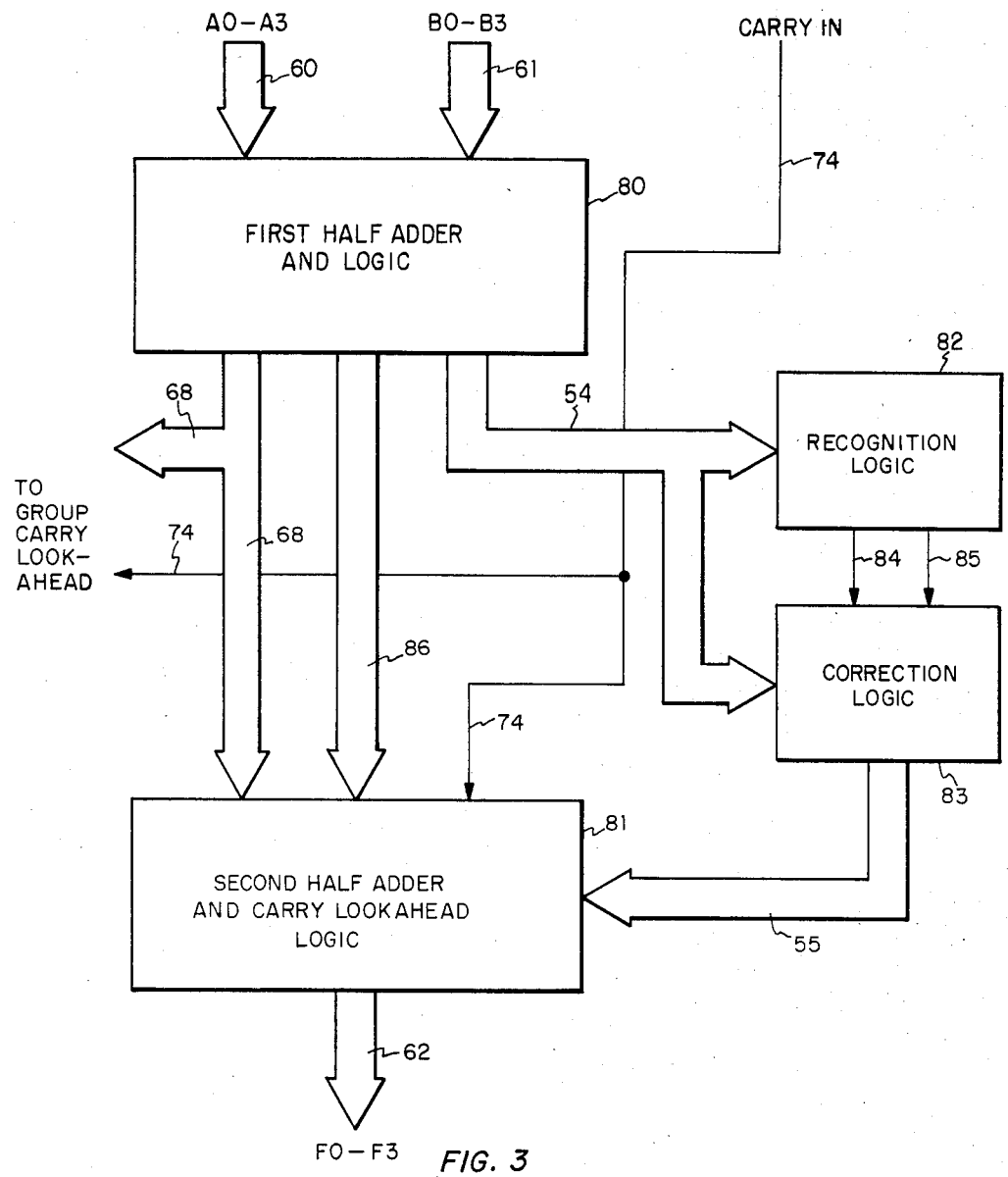
FIG. 3 is a subsystem configuration of the ALU in the present invention.

FIG. 3 is an illustration of the structure of an ALU unit 41 of the present invention, which, connected in parallel with other ALU units 41, form the ALU 11. The ALU 41 has a first half adder and logic block 80 which receives the 4 bit signals A0–A3 and B0–B3 of the operands A and B, shown in the arrows 60 and 61. The block 80 generally performs the various arithmetic and logic functions upon the operands A and B before passing them on to a second half adder and internal carry lookahead logic block 81 along the data paths 86 and 68. The block 81 also receives the carry in signal from the line 74. The output signals F0–F3 of the block 81 are the ALU results.

Figure 4:
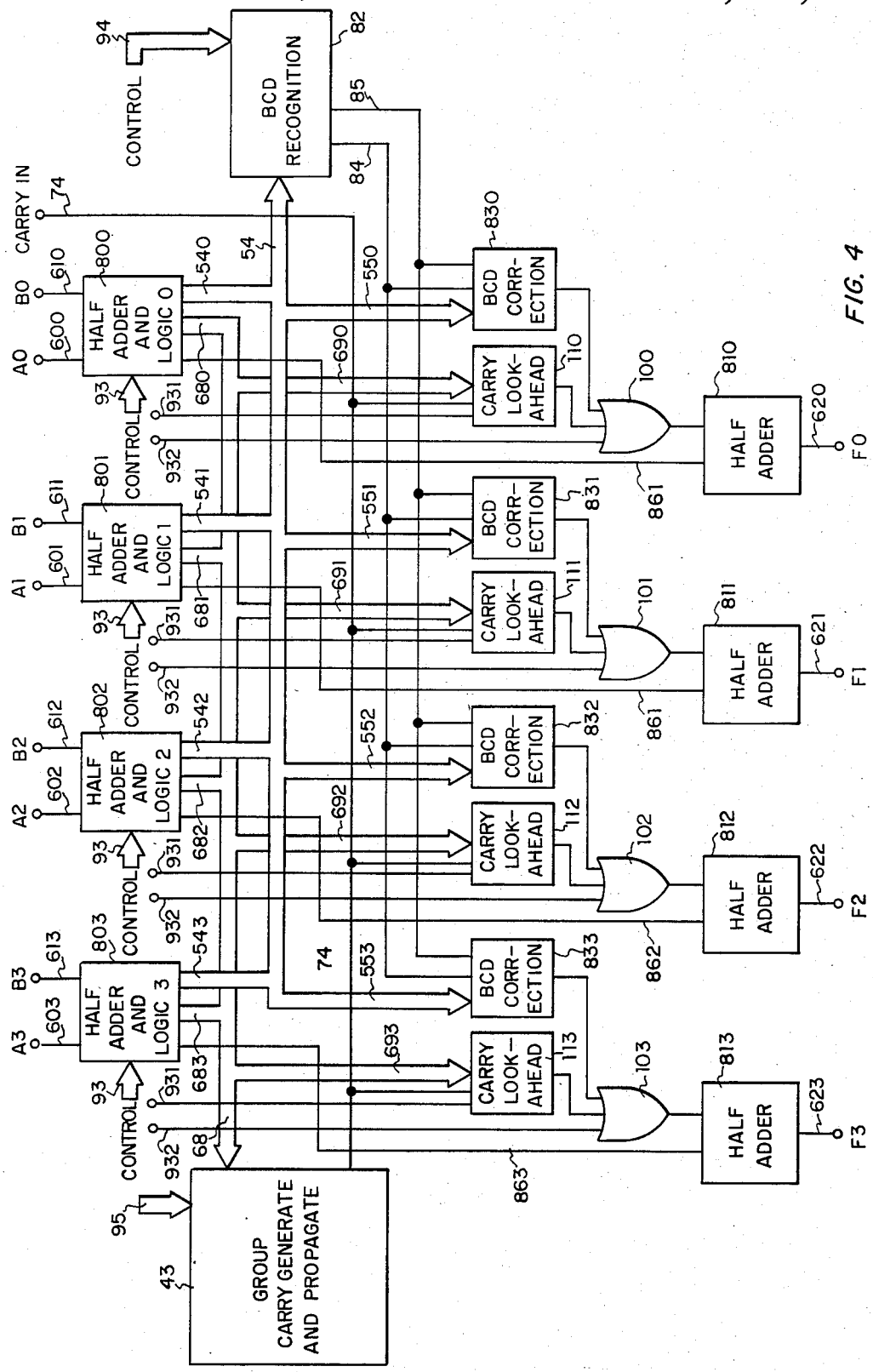
FIG. 4 is a more detailed view of the subsystem units of the ALU shown in FIG. 3.

FIG. 4 is a more detailed view of 4-bit ALU unit 41 in FIG. 3. Each ALU unit 41 accepts the correspondingly significant bit signals of the operand A and B. Accordingly, the bit unit 0 accepts the A0 and B0 bit signals on the input lines 600 and 610 respectively, the bit unit 1 accepts A1 and B1 signals on lines 601 and 611, and so on. Each bit unit has a first half adder and logic circuit 800–803 which generates carry generate and propagate signals internal to the 4-bit ALU unit. These internal carry generate and propagate signals are sent to the carry lookahead circuits 110–113 along the paths 680–683 respectively and to the group carry generate and propagate block 43, which generates the carry out signal, group carry generate and propagate signals for the 4-bit unit.

Each unit has the second half adder and carry lookahead logic block 81 in FIG. 3 separated into its carry lookahead circuit 110–113 which accepts the internal carry generate and propagate signals for logical combination with the incoming carry in signal along the line 74. The output signal of each carry lookahead circuit 110–113 goes to its respective OR gate 100–103, which sends its output signal to the half adder adder circuit 810–813. Combining signals directly from the first half adder and logic circuit 800–803 along the line 860–863, the second half adder circuit 810–813 generates an ALU result signal F0–F3. The control lines 93, 931 and 932 operate so that the ALU described operates a standard ALU for arithmetic and logic operations.

Figure 5A:
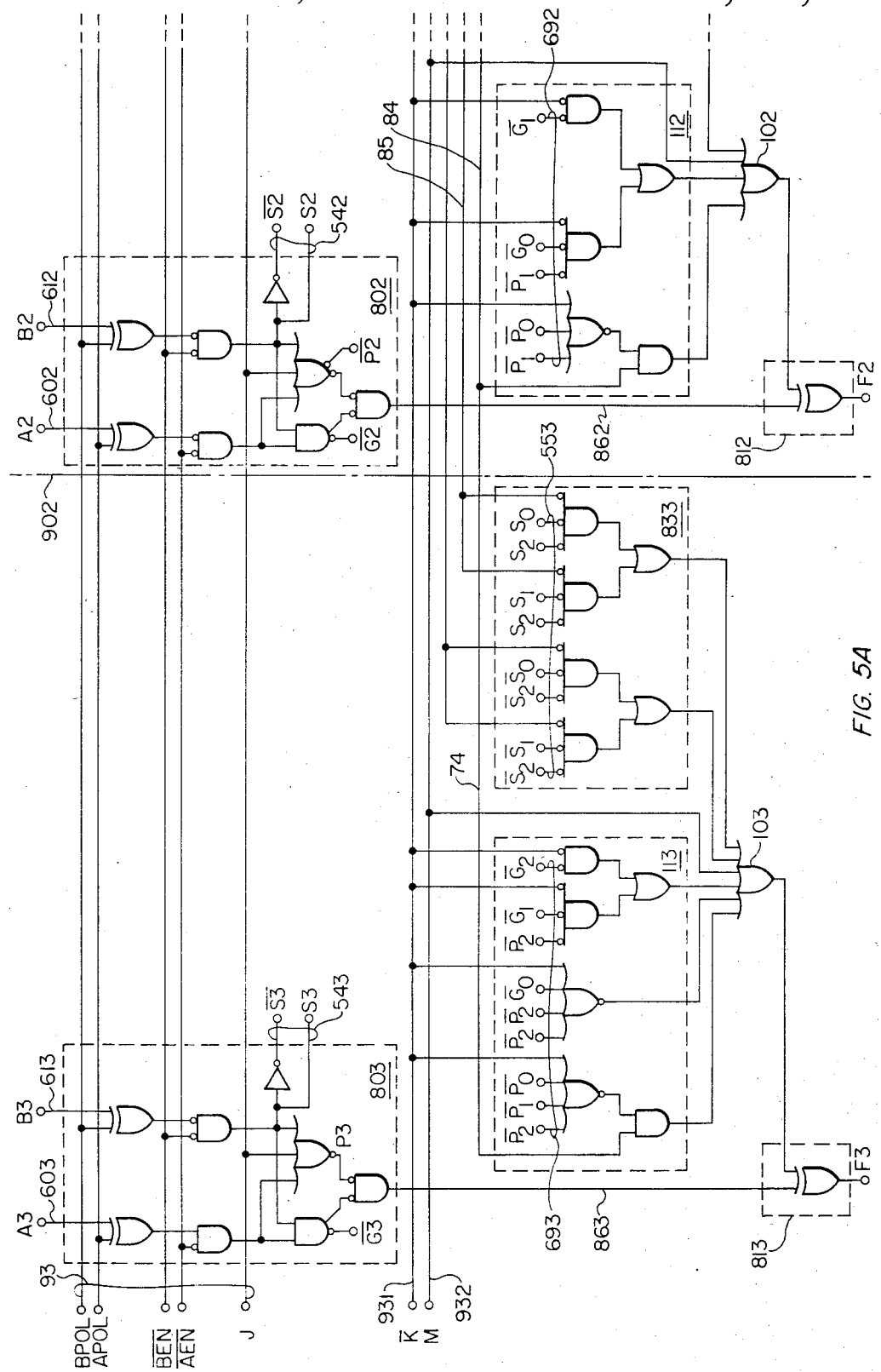
FIG. 5 is a unitary drawing of FIGS. 5A and 5B.

FIG. 5, a unitary drawing of FIGS. 5A and 5B, illustrates the detailed logic schematic of the ALU 41, according to one embodiment of the present invention.

By the dashed lines 900-902 the ALU unit 41 is visually divided into the four parts which receive the input operand signals A0-A3 and B0-B3. Each of the first half adder and logic circuits 800-803 receive each respective input signals on its input lines 600-603 for the A signals, and input lines 610 to 613 for B signals. Each first half adder and logic circuit 800-803 in response to the control lines 93 generates internal carry generate and propagate signals G0-G3, P0-P3, and their complements. A combination of these signals, the sum of A and B, is sent to each respective second half adder circuit 810-813, which is an EXCUSIVE OR logic gate. The internal carry generate and propagate signals are also sent to each respective carry lookahead circuit 110-113, which is under the control of a signal on a control line 133. The signals from the carry lookahead logic from the input to the respective OR gates 100-103. The lines for the internal generate and propagate signals are not shown on FIG. 5 in the interest of visual clarity. It is understood that connecting lines exist between the first half adder and logic circuit 800-803 and the carry lookahead circuits 110-113 for the carry generate and propagate signals. The carry lookahead circuits 110-113 also receive carry in signals on the line 74.

Figure 7A:
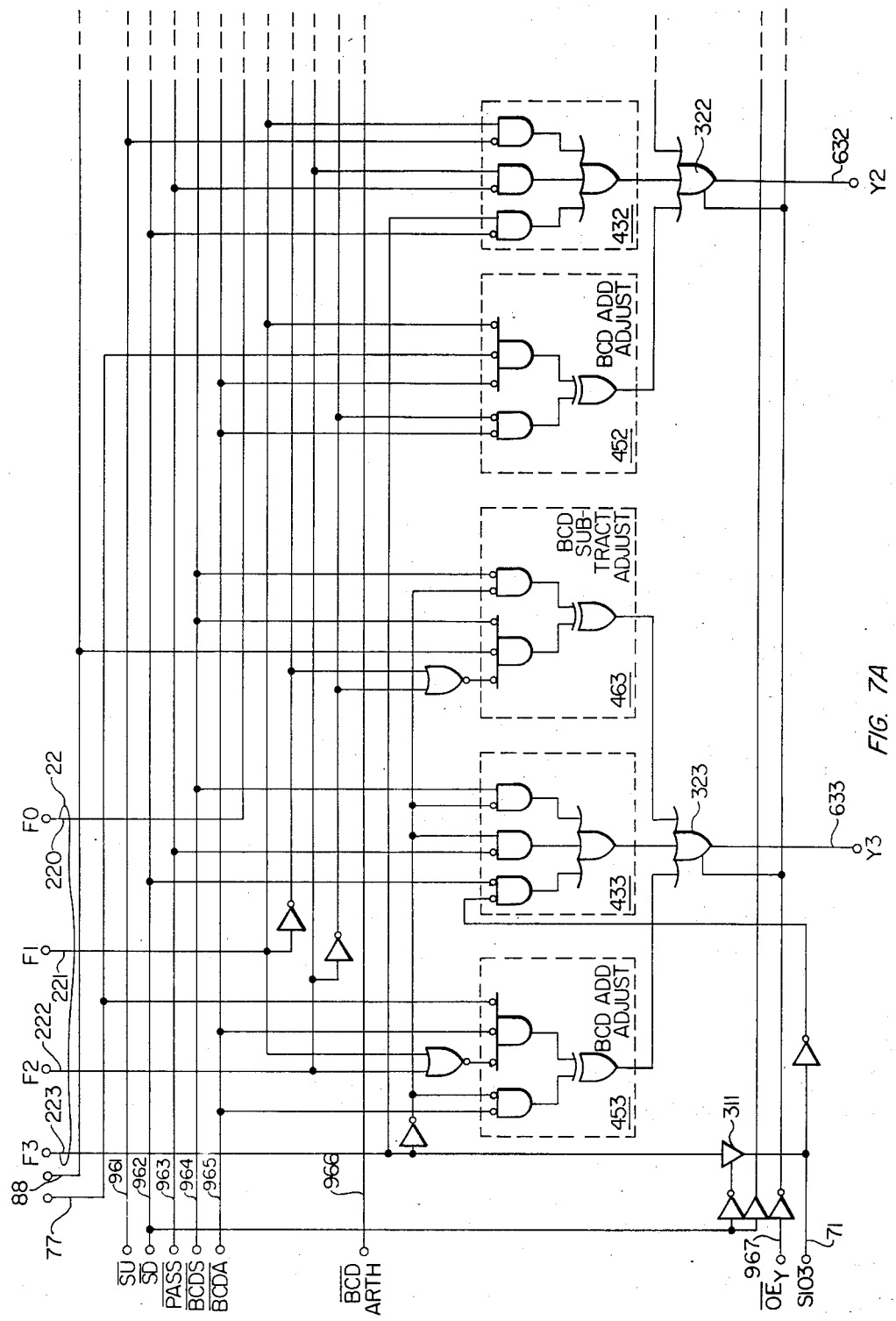
FIG. 7 is a unitary drawing of FIGS. 7A and 7B.

Unitary FIG. 7, formed by FIGS. 7A and 7B, displays a combined shifter/adjuster at the logic gate level. Instead of the separate shifter 42 and adjuster 45 of FIG. 2, the logic gates for the shifting and adjusting functions are intermixed. The shifter logic gate circuits are enclosed by dotted lines and numbered 430-433 to receive input signals, F0-F3, on the input lines 220-223. These shifter logic gate circuits are controlled by the control lines 961-963, which are active low and represent the "shift up," "shift down" and "pass" functions of the shifter 42. For example, when a shift down operation is required, the line 962 goes low and the input signal F0 appears on the shifter input/output line 300. The signal F1 appears on the output line 30, F2 on the line 31, F3 on the line 32 and the signal placed on the shifter input-/output line 71 appears on the line 33.

When a shift up is desired, the line 961 goes low instead and all of the input signals F0-F3 from the ALU 41 are shifted up. The line 70 becomes an input line and its signal appears on the output line 630, while the input signal F3 appears on the shifter input/output line 71.

To perform the BCD to binary conversion and the binary to BCD conversion, iterative operations must be performed by the CPU in FIG. 1 with the ALU 11 performing corrections, if required, to the data passing through.

An example of a conversion of an operand in BCD format into binary format is illustrated in FIG. 8A. The operand to be converted in decimal is the number "2904". Initially, the binary signals or bits, in BCD format are loaded into the register file 10 in the CPU in FIG. 1. The bits can be considered to be divided into decimal units corresponding to 4 binary bits each with the most significant 4 bits being "2" or "0010" in binary, the next less significant slice "9" or "1001", the next less significant "0" or "0000", and the least significant 4 bits "4" or "0100". The contents of each 4-bit units, or decimal digits, are listed in the left four columns in FIG. 8A.

Operationally, the contents of the file 10 are passed through the ALU 11 without change to the shifter 12. At this point the shifter 12 shifts down to place its least significant bit, a "0" into the shift register 14 via the path 30. The contents of the shift register 14 are shown in the pyramid of "1"'s and "0"'s in the middle columns of FIG. 8A.

The shifted contents of the shifter 12 are then recycled back into the register file 10 along the paths 23, 24. From the register file 10, the once-shifted data is sent along the path 21 into the ALU 11 for correction. Since each 4 bits of the data represents one decimal digit in BCD, each of the slices processes a BCD digit. By shifting down the bits, the BCD number is divided by one-half. However, when a "1" is shifted down from one BCD digit to another BCD digit, the "1" representing a value of 10 in the more significant BCD digit now represents a value of 8 in the less significant BCD digit since a "1" now appears in the position of the most significant of the binary bits of the less sigificant BCD digit. The shifted "1" should represent a value of 5 in the less significant BCD digit. Therefore, a correction by subtracting a value of 3 (0011 in binary) must be performed on that BCD digit. Such a correction in cycle 1 is made to the BCD digit 1 ("1000" in binary), which becomes "0101" after the correction.

The once-shifted and corrected data is cycled once more by shifting the data in shifter 12 down with the shift register 14 accepting the least significant bit shifted down and out of the shifter 12, a "0". The twice shifted data is sent back through data paths 23, 24 to the register file 10 ad then back through the path 21 into the ALU 11 for correction. In this second cycle corrections must be made to the BCD digits 2 ad 0 as indicated in FIG. 8A.

As the BCD data is cycled, the data is shifted down to allow the incoming bit to enter and the augmented data is stored in the shift register 14.

After 16 cycles, the decimal number, "2904", is converted from BCD format into the binary number, "0000 1011 0101 1000", which is sent from the shift register 14 along the paths 27, 28 and 29 as output signals.

Conversely, the present invention permits the conversion of operands in binary into BCD format. In FIG. 8B the binary result of the above example "000010110101 1000", is used as an example for conversion into BCD. These data are fed into the CPU system along paths 29, 28 and 25 to the shift register 14 which shifts the data up one bit at a time. The shifted bit "0" is transferred to the shifter 12 along the path 30 and is the first of many bits which will form the BCD digits. These BCD digits are subjected to BCD correction by passing the contents of the shifter 12 along the paths 23, 24 into the register file 10 and then into the ALU 11 by the path 21 for correction.

Corrections for binary to BCD conversion are implemented in the ALU 11 by adding 3 to each BCD digit equal or greater than the value of 5 and each cycle has a "correct, then shift" order. In the example of FIG. 8B, the first correction is made in the eighth cycle. At that point the BCD digit 0 has the contents, "0101" or 5, which is corrected to "1000" or 8. The cycle is completed by a shifting operation.

Each shifting operation occurs after the ALU 11 releases the bits processed for correction into the shifter 12. These bits are shifted one bit space up by the shifter 12, which also receives the next bit shifted out from the binary bits in the shift register 14 and places that bit in the least sigificant bit position. Those shifted bits are then sent back into the register file 10 for temporary storage.

After 16 iterations, shift register 14 is empty. The data in the shifter 12 is "0010 1001 0000 0100" in BCD (or "2904" in decimal).

It should be noted that the algorithms of shifting and correcting operands for BCD to binary and binary to BCD conversions, as exemplified in FIGS. 8A and 8B, are well known, and are often implemented by computer programs. However, such software conversions consume a great deal of time if the overall system requires much conversion. Moreover, if conversion times are of concern, various forms of "hardware" have been designed. One such design, for example, using a microprogramming approach is shown in FIG. 28, page 155, in the Mick and Brick book cited above.

The present invention provides for an advance in the art by which the ALU 11 is able to make the necessary corrections to the iteratively processed bits in a minimal amount of time in order that the BCD to binary and binary to BCD conversions are performed as described very quickly as compared to present designs. Furthermore, the present invention is compatible with existing ALU designs so that minimal redesign of existing circuits is required to implement the present invention.

The present invention is implemented by the design of each ALU unit 41 which performs the correction function on its respective 4 bits of data as the data set is cycled through the ALU 11 on each cycle.

When BCD to binary conversions are being performed, the ALU unit 41 corrects the data passing through at each iteration as required. Each ALU unit 41 in FIG. 3 has a recognition logic block 82 which receives the true or complementary signals of the signals B0–B3 signals, representing a part of the data to be corrected. The input signals B0–B3 from the register file 10 enters the ALU 41 along the path 61. The path 60 is not operational during BCD conversion operations. The recognition logic block 82 receives these signals on the path 54 from the first half adder and logic block 80 to determine whether the signals B0–B3 are to be corrected. If correction is required, the block 82 sends enabling signals along the lines 84, 85 to a correction logic block 83 which, in turn, sends correction signals along a path 55 to the second half adder and carry lookahead logic block 81 so that a corrected result appears on the path 62.

In FIG. 4 the BCD correction block 83 is divided into its bit circuit constituents 830–833. When the CPU is in a BCD conversion mode, the data is passed through B operand data paths and the BCD recognition block 82 receives the true or complementary signals of the B operand signals B0–B3 along the path 54. In response to the control signals on the path 94, the block 82 generates signals on the lines 84 and 85 to the BCD correction blocks 830–833.

For example, if the control signals set the BCD recognition block 82 for conversion from BCD to binary, the block 82 determines whether the signals B0–B3 represent a number having a value of 8 or greater. If B0–B3 are indeed 8 or greater, the block 82 sends signals on the lines 84 and 84 to the BCD correction circuits 830–833 to effectively substract "3" from B0–B3, the result appearing as F0–F3.

Likewise, for binary to BCD conversion, the block 82, upon determination that the signals B0–B3 require correction when equal to or greater than "5", sends signals to the BCD corrections 830–833 to add "3" to B0–B3.

As shown in FIG. 5, the data to be converted are sent on the input lines 610–613, while the lines 600–603 are disabled. The first half adder and logic circuits 800–803 generate signals S0–S3 and their complements, which are merely true and complementary signals of that on the input lines 610–613 during BCD conversion operations. These signals are sent to the BCD recognition circuit 82 which has two control lines 941 and 942. The logic of the circuit 82 is such that a high signal on the line 941 indicates that the conversion is from BCD format to binary format. A high signal on the control line 942 indicates that the conversion is from binary to BCD. Of course, both these lines 941–942 cannot be high at the same time.

From the BCD recognition block 82 the signals for controlling the correction of the data passing through the ALU is sent along the lines 84 and 85. The BCD correction circuits 830–833 send their control signals through the OR gate 100–103 to make the correction upon the data, responsive to the signals S0–S3 and their complements. It is understood that there are connecting lines from the first half adder logic circuits 800–803 to the BCD recognition logic circuit 82 and the respective BCD correction circuits 830–833 to carry the signals S0–S3 and their complements.

As discussed previously for BCD to binary conversion, a value of A121/3 is subtracted from the BCD digit when a "1" is shifted down into that BCD digit from the next most significant BCD digit. Each ALU unit 41 handles one BCD digit, i.e., the four binary bits B0–B3 representing the BCD digit. The logic equations for subtracting a value 3 from the BCD digit are $F_0 = B_0 \oplus 1$ $F_1 = B_1 \oplus B_0$ $F_2 = B_2 \oplus \overline{(B_1 + B_0)}$ $F_3 = B_3 \oplus (\overline{B_1}\overline{B_2} + \overline{B_0}\overline{B_2})$.

When a "1" has been shifted into an ALU unit 41, that signal appears as the B3 bit. The control line 941 is low and the control line 942 is high for a BCD to binary conversion operation. The set of control lines 93 are set such that $\overline{BEN}$ is low to enable the B operand signals and $\overline{AEN}$ is high to disable any A operand signals. The BPOL signal is high to maintain the polarity of the B0–B3 signals, while the APOL is in a "don't care" mode since any A0–A3 signals are disabled. The J control line is low to allow the B0–B3 signals to pass through the first half adder block 800–803. The $\overline{K}$ control signal, which enables the blocks 110–113 for internal carry and propagate signals, is set high to disable the blocks. The M control signal, which forces a carry on each bit of the ALU 41 when set high, is set low.

With this set of control signals, the signals S0–S3 are respectively the same as the signals as B0–B3. When a "1" is shifted down into an ALU unit 41 processing one BCD digit, the "1" will appear as B3 (or S3). Since $\overline{S3}$ equal "0", the $\overline{DCO}$ control signal is low while $\overline{DC1}$ is high, the line 84 is low and the line 85 is high. These signals cause the BCD correction circuits 830–833 to subtract 3 from the binary bits B0–B3 as given by the set of logic equations above. When a "0" is shifted low into B3, no such correction is made.

On the other hand, for a binary to BCD conversion, the ALU unit 41 adds 3 to B0–B3, whenever these bits are equal to 5 or greater.

The control signals are set the same as for a BCD to binary conversion except that the $\overline{DC0}$ is now high and $\overline{DC1}$ is low. The line 84 is thus high. The line 85 is also high unless B0–B3 (S0–S3) is equal to or greater than 5. When the line 85 is low, the BCD correction logic circuits 830–833 are enabled into the logic combinations for the resulting bits F0–F3 of the ALU unit 41, which are:

$$F_0 = B_0 \oplus 1$$

$$F_1 = B_1 \oplus \overline{B}_0$$

$$F_2 = B_2 \oplus (B_1 + B_0)$$

$$F_3 = B_3 \oplus (B_1 B_2 + B_0 B_2)$$

A value of 3 is added to the BCD digit represented by the bits $B_0$–$B_3$. The ALU unit 41 corrects the BCD digit, as desired, in a binary to BCD conversion cycle. When B0–B3 (S0–S3) is less than 5, the BCD correction logic 830–833 is disabled and the bits B0–B3 pass through the ALU unit 41 uncorrected.

Furthermore, the present invention provides for the CPU to perform BCD arithmetic operations besides ordinary binary operations. FIG. 2 is an illustration of the ALU unit 41, the group carry generate and propagate block 43, the shifter 42 and an adjuster 46 in parallel with the shifter 42. The ALU unit 41 accepts the operands A (A0–A3) and B (B0–B3) and obtains, either by addition or subtraction, some arithmetic result F (F0–F3) in binary. If the operands are in BCD format, the result F must be adjusted into BCD and operation of the group carry generate and propagate block 43 modified to generate signals in accordance with BCD format.

In the present invention the block 43 accepts the internal carry generate and propagate signals on the path 68 from the ALU unit 41. In combination with the carry in signal on the line 74, the block 43 responsive to control signals indicating BCD arithmetic mode, generates carry out signals on the lines 77 and 88 when the sum of A and B exceed the value 9 (in contrast to the value of 16 in binary arithmetic mode) or when the difference of A and B exceed the value 9. Similarly the group generate and propagate signals on the lines 78, 79 operate in BCD. The carry out signals from the block 43 are received by the adjuster 46 which adds a value of 6 or adds a value of 10 to the result F for adjustment into BCD format, depending whether an add or subtract operation is being performed. Because the adjuster 46 is parallel to the shifter 42, there is no speed loss for BCD arithmetic operation with the ALU-adjuster combination compared to binary arithmetic operation with the ALU-shifter combination.

Figure 6A:
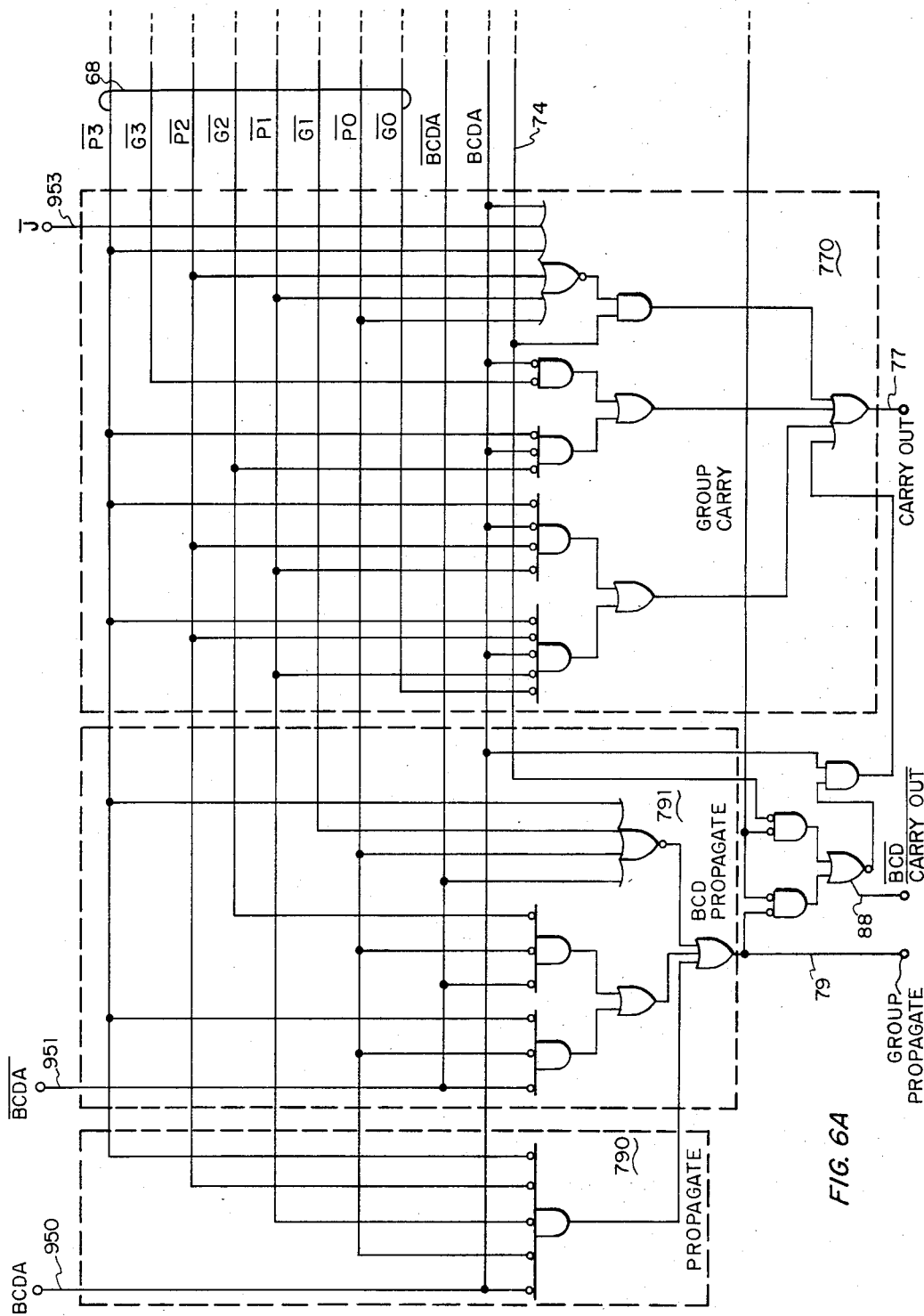
FIG. 6 is a unitary drawing of FIGS. 6A and 6B.

FIG. 6, a unitary drawing of FIGS. 6A and 6B shows the logic schematic of the group carry generate and propagate block 43, which has a group carry circuit 770, a group carry generate circuit 780, a BCD group carry generate circuit 781, a group carry propagate circuit 790, and a BCD group carry propagate circuit 791. These circuits receive the internal carry generate and propagate signals on the set of lines 68 from the ALU unit 41 as input signals and are controlled by signals on the control lines 950–953.

In normal binary arithmetic operation the control line 950 (BCDA) is low and the line 951 ($\overline{BCDA}$) is high. As can be seen from FIG. 6, the BCD circuits 781 and 791 are inoperative, so that the remaining three circuits operate to provide the group carry out, generate and propagate signals in binary on the output lines 77, 78 and 79. The line 88 also carries signals during binary operation; however, these signals are blocked and ignored by normally receptive circuits during BCD operation.

When BCD add arithmetic operation is required, the control line 950 is high and the line 951 is low, disabling the group carry propagate and generate circuits 790, 780 and most of the carry out circuit 770.

The BCD group carry generate and propagate circuits 781, 791 then transmits BCD group carry generate and propagate signals on the group carry generate line 79 and group carry propagate line 78 respectively. The carry out circuit 770, having most of its logic disabled, is then capable of generating a BCD format carry out signal. True BCD carry out signals appear on the line 77 and complementary signals on the line 88. As explained above, a BCD carry out signal is generated whenever the sum of A0–A3, B0–B3, and the carry in exceed the value 9.

In FIG. 7 the BCD adjust logic circuits 450–453 and 461–463, which are also enclosed by dotted lines, are broken into two circuits for each output line 630–633 to perform the BCD add adjust function and the BCD subtact adjust function. The exception is the BCD adjust logic circuit 450 which performs both BCD add and subtract under the control of the line 966, which is active low. The line 966 is low whenever a BCD add or subtract adjust function is to be performed. Additionally, the circuit 450 also performs the "pass" function for shifting operations, in which case FO appears on the line 30. The input signal passes through without shifting.

The BCD adjust functions are performed in response to the control lines 964 and 965, which carry the BCD add and BCD subtract signals respectively.

In BCD add operations the BCD arithmetic adjust circuits 450–453 add the value of 6 to the input signals F0–F3 responsive to the BCD carry out signals on the input lines 77 and 88. To perform the adjustment of adding 6 to the ALU result F0–F3, the BCD add adjust circuits 450–453, combine the BCD carry out signal $C_{OUTBCD}$ and F0–F3 in the following manner:

$$Y0 = F0$$

$$Y1 = \overline{F1} \cdot C_{OUTBCD} + F1 \cdot \overline{C}_{OUTBCD} = F1 \oplus C_{OUTBCD}$$

$$Y2 = F2 \oplus (\overline{F1} \cdot C_{OUTBCD})$$

$$Y3 = F3 \oplus ((F1 + F2) \cdot C_{OUTBCD})$$

To perform the BCD subtract operation, the ordinary binary result obtained from subtracting two operands is utilized and then adjusted into a BCD format. The ALU 41 performs the subtract operation by a two's complement operation. That is, the operand which is the subtrahend is complemented and added to the other operand which is the minuend. The result may be incremented by one by a carry in signal depending upon whether a borrow occurs from the next less significant digit to obtain the correct difference.

For the BCD subtract operation the carry lookahead logic block 43 in FIG. 6 operates in the same fashion as for ordinary binary operations. The control line 950 is low and the line 951 is high. The adjuster block in the BCD subtract operation, with the control lines 964 and 966 low and the other control lines high, adjusts the ALU result when a carry out signal is not generated. A BCD adjustment is required when the subtrahend is larger than the minuend. This negative result is signified by the absence of a carry out signal, which indicates a borrow from the next most significant BCD digit. Thus the BCD subtract adjust circuits 461–463 are activated by a low signal (no carry out) on the line 88. A BCD subtract adjustment is performed by subtracting a value of 6, or equivalently, adding a value of 10 to the ALU result. The logic circuits 450, 461–463 in FIG. 7 perform the BCD adjustment by adding a value of 10. The particular logic is as follows:

$Y0 = F0$ $Y1 = \overline{F1} \cdot C_{OUTBCD} + F1 \cdot \overline{C_{OUTBCD}} = F1 \oplus C_{OUTBCD}$ $Y2 = F2 \oplus (\overline{F1} \cdot C_{OUTBCD})$ $Y3 = F3 \oplus ((F1 + F2) \cdot C_{OUTBCD})$ In this manner a value of 10 is added to F0–F3 to get the properly adjusted result Y0–Y3.

Accordingly, while the invention has been particularly shown and described with reference to the preferred embodiments, it would be understood by those skilled in the art that changes in form and details may be made therein without departing from the spirit of the invention. It is therefore intended that an exclusive right be granted to the invention as limited only by the metes and bounds of the appended claims.

What is claimed is:

1. In a circuit for converting binary digital signals into BCD digital signals by correcting and shifting said binary signals iteratively, an ALU for correcting said binary digital signals comprising:
recognition combinatorial logic means responsive to said binary digital signals for generating an enabling signal,
correction combinatorial logic means responsive to said enabling signal and said binary digital signals for generating correction signals,
half adder means responsive to said binary digital signals and said correction signals for generating corrected signals and
additional half adder and logic means responsive to said binary digital signals, said additional half adder and logic means generating true and complementary signals of said binary signals for said recognition logic means and said correction means, and true signals for said half adder means.

2. In a circuit for converting BCD digital signals into binary digital signals by shifting and correcting said BCD digital signals iteratively, an ALU for correcting said BCD digital signals comprising:
recognition combinatorial logic means responsive to said binary digital signals for generating an enabling signal.

3. In a circuit for selectively converting digital signals from binary into BCD or BCD into binary by shifting and correcting said digital signals iteratively, an ALU for correcting said digital signals, said ALU comprising first half adder and logic means responsive to said digital signals for generating true and complementary signals of said digital signals,
recognition logic means responsive to said true and complementary signals for generating enabling signals,
correction logic means responsive to said enabling signals and said true and complementary signals for generating correction signals, and
second half adder means responsive to said true signals and said correction signals for generating corrected signals.

4. A data path of a CPU having an ALU, a shifter responsive to ALU output signals, means for transferring shifter output signals to said ALU as input signals for iterative operations, and a shift register means accepting signals shifted out from said shifter and shifting out signals to said shifter, for selectively converting digital signals representing a number from binary to BCD or BCD into binary by iteratively shifting said signals between said shifter and said shift register means and correcting said digital signals with said ALU, said ALU comprising
first half adder and logic means responsive to said digital signals for generating true and complementary signals of said digital signals,
recognition logic means responsive to said true and complementary signals for generating enabling signals,
correction logic means responsive to said enabling signals and said true and complementary signals for generating correction signals, and
second half adder means responsive to said true signals and said correction signals for generating corrected signals.

5. The data path of a CPU as in claim 4 wherein, for the selection of conversion from binary to BCD, said digital signals are corrected by said ALU and shifted from said shift register means to said shifter iteratively.

6. The data path as in claim 4 wherein, for the selection of conversion from BCD to binary, said digital signals are shifted from said shifter to said shift register means and corrected by said ALU iteratively.

7. The data path as in claim 5 wherein said ALU corrects said digital signals by units of 4, said recognition logic means generating an enabling signal when said unit has a value of 5 or greater, and said correction logic means responsive to said enabling signal corrects said unit by adding a value of 3 thereto.

8. The data path as in claim 7, the unit of digital signals Bi, i=0 to 3, wherein said correction logic means corrects said unit in accordance with the following equations:

$F0 = B0 \oplus 1$ $F1 = B1 \oplus \overline{B0}$ $F2 = B2 \oplus \overline{(B1 + B0)}$ $F3 = B3 \oplus (B1\ B2 + B0\ B2)$ where Fi, i=0 to 3, are the corrected digital signals.

9. The data path as in claim 6 wherein said ALU corrects said digital signals by units of 4, said recognition logic means generates an enabling signal when said unit has a value of 8 or greater, and said correction logic means responsive to said enabling signal corrects said unit by subtracting a value of 3 therefrom.

10. The data path as in claim 9, the unit of digital signals Bi, i=0 to 3, wherein said correction logic means corrects said unit in accordance with the following equations:

$F0 = B0 \oplus 1$ $F1 = B1 \oplus B0$ $F2 = B2 \oplus (B1 + B0)$ $F3 = F3 \oplus (\overline{B1}\ \overline{B2} + \overline{B0}\ \overline{B2})$ where Fi, i=0 to 3, are the corrected digital signals.

11. A CPU having an ALU, an adjuster unit, a shifter unit and a shift register unit, said CPU capable of selectively forming the sum or difference of a first BCD operand and and a second BCD operand by arithmetically combining said BCD operands with said ALU to form results in binary, said ALU results dependent upon the arithmetic operation selected, and adjusting said binary ALU results with said adjuster unit into BCD format, said adjustment dependent upon the arithmetic operation selected;

said CPU further capable of selectively converting an operand from binary to BCD format or from the BCD to binary format by iteratively shifting said operand between said shifter unit and said shift register unit and correcting said operand with said ALU, the direction of said shift and said ALU correction dependent upon the conversion selected.

12. A CPU as in claim 11 wherein said operand is shifted one bit from said shift register to said shifter and said shifted operand bits corrected by said ALU in one cycle, said cycle iterated a predetermined number of times for a binary to BCD conversion.

13. A CPU as in claim 12 wherein said operand is shifted one bit from said shifter to said shift register and said remaining operand bits corrected by said ALU in one cycle, said cycle iterated a predetermined number of times for a BCD to binary conversion.

* * * * *